(12) United States Patent
Kotter

(10) Patent No.: US 9,472,699 B2
(45) Date of Patent: Oct. 18, 2016

(54) ENERGY HARVESTING DEVICES, SYSTEMS, AND RELATED METHODS

(75) Inventor: Dale K. Kotter, Shelley, ID (US)

(73) Assignee: Battelle Energy Alliance, LLC, Idaho Falls, ID (US)

( * ) Notice: Subject to any disclaimer, the term of this patent is extended or adjusted under 35 U.S.C. 154(b) by 993 days.

(21) Appl. No.: 13/601,592

(22) Filed: Aug. 31, 2012

(65) Prior Publication Data

US 2015/0303335 A1    Oct. 22, 2015

(51) Int. Cl.

| H01L 31/042 | (2014.01) |
|---|---|
| H01L 31/0232 | (2014.01) |
| H01Q 1/38 | (2006.01) |
| H01Q 21/06 | (2006.01) |
| G02B 5/28 | (2006.01) |
| H01L 35/00 | (2006.01) |

(52) U.S. Cl.
CPC ............. *H01L 31/042* (2013.01); *G02B 5/281* (2013.01); *H01L 31/02322* (2013.01); *H01L 35/00* (2013.01); *H01Q 1/38* (2013.01); *H01Q 21/061* (2013.01); *H01Q 21/062* (2013.01)

(58) Field of Classification Search
CPC ........... H01L 31/042; H01L 31/02322; H01L 35/00; H01L 31/04; G02B 5/281; H02Q 1/061; H01Q 21/062; G01J 1/4228; G01J 1/44; G01J 3/2803; G01J 5/0837
See application file for complete search history.

(56) References Cited

U.S. PATENT DOCUMENTS

| 4,360,741 A | 11/1982 | Fitzsimmons et al. |
|---|---|---|
| 4,445,050 A | 4/1984 | Marks |
| 4,720,642 A | 1/1988 | Marks et al. |
| 5,043,739 A | 8/1991 | Logan et al. |
| 5,313,216 A | 5/1994 | Wang |
| 5,381,157 A | 1/1995 | Shiga |
| 5,436,453 A | 7/1995 | Chang et al. |

(Continued)

FOREIGN PATENT DOCUMENTS

| WO | 2004/093497 A1 | 10/2004 |
|---|---|---|
| WO | 2009064736 A1 | 5/2009 |
| WO | 2012150599 | 11/2012 |

OTHER PUBLICATIONS

PCT International Search Report and Written Opinion of the International Searching Authority for PCT/US2013/021392, dated Apr. 2, 2013, 10 pages.

(Continued)

*Primary Examiner* — John Lee
(74) *Attorney, Agent, or Firm* — TraskBritt

(57) ABSTRACT

Energy harvesting devices include a substrate and a plurality of resonance elements coupled to the substrate. Each resonance element is configured to collect energy in the visible and infrared light spectra and to reradiate energy having a wavelength in the range of about 0.8 μm to about 0.9 μm. The resonance elements are arranged in groups of two or more resonance elements. Systems for harvesting electromagnetic radiation include a substrate, a plurality of resonance elements including a conductive material carried by the substrate, and a photovoltaic material coupled to the substrate and to at least one resonance element. The resonance elements are arranged in groups, such as in a dipole, a tripole, or a bowtie configuration. Methods for forming an energy harvesting device include forming groups of two or more discrete resonance elements in a substrate and coupling a photovoltaic material to the groups of discrete resonance elements.

19 Claims, 5 Drawing Sheets

(56) References Cited

U.S. PATENT DOCUMENTS

| | | | |
|---|---|---|---|
| 5,712,647 A | 1/1998 | Shively | |
| 5,773,831 A | 6/1998 | Brouns | |
| 6,289,237 B1 | 9/2001 | Mickle et al. | |
| 6,295,029 B1 | 9/2001 | Chen | |
| 6,373,447 B1 | 4/2002 | Rostoker et al. | |
| 6,396,450 B1 | 5/2002 | Gilbert | |
| 6,534,784 B2 | 3/2003 | Eliasson et al. | |
| 6,756,649 B2 | 6/2004 | Moddel et al. | |
| 6,856,291 B2 | 2/2005 | Mickle et al. | |
| 6,870,511 B2 | 3/2005 | Lynch | |
| 6,870,517 B1 | 3/2005 | Anderson | |
| 6,882,128 B1 | 4/2005 | Rahmel | |
| 6,885,355 B2 | 4/2005 | Killen | |
| 6,900,763 B2 | 5/2005 | Killen | |
| 6,911,957 B2 | 6/2005 | Brown | |
| 6,924,688 B1 | 8/2005 | Beigel | |
| 6,965,353 B2 | 11/2005 | Shirosaka et al. | |
| 6,965,355 B1 | 11/2005 | Durham | |
| 6,977,615 B2 | 12/2005 | Brandwein, Jr. | |
| 6,995,733 B2 | 2/2006 | Waltho | |
| 7,057,514 B2 | 6/2006 | Mickle et al. | |
| 7,068,225 B2 | 6/2006 | Schantz | |
| 7,070,406 B2 | 7/2006 | Jeans | |
| 7,071,889 B2 | 7/2006 | McKinzie, III et al. | |
| 7,083,104 B1 | 8/2006 | Empedocles et al. | |
| 7,084,605 B2 | 8/2006 | Mickle et al. | |
| 7,088,306 B2 | 8/2006 | Chiang et al. | |
| 7,119,161 B2 | 10/2006 | Lawandy | |
| 7,190,315 B2 | 3/2007 | Waltho | |
| 7,190,317 B2 | 3/2007 | Werner et al. | |
| 7,190,326 B2 | 3/2007 | Voeltzel | |
| 7,228,156 B2 | 6/2007 | Gilbert | |
| 7,250,921 B1 | 7/2007 | Henry et al. | |
| 7,253,426 B2 | 8/2007 | Gorrell et al. | |
| 7,256,753 B2 | 8/2007 | Werner et al. | |
| 7,329,871 B2 | 2/2008 | Fan et al. | |
| 7,436,373 B1 | 10/2008 | Lopes et al. | |
| 7,486,236 B2 | 2/2009 | Sarehraz et al. | |
| 7,792,644 B2 | 9/2010 | Kotter et al. | |
| 8,071,931 B2 | 12/2011 | Novack et al. | |
| 8,283,619 B2 * | 10/2012 | Novack | H01Q 1/248 250/208.2 |
| 8,338,772 B2 * | 12/2012 | Kotter | H01Q 1/248 250/208.2 |
| 8,847,824 B2 * | 9/2014 | Kotter | H01Q 1/248 343/700 MS |
| 8,901,507 B2 * | 12/2014 | Kotter | G01T 3/00 250/338.1 |
| 8,922,454 B2 * | 12/2014 | Danesh | H01G 9/20 343/904 |
| 9,018,616 B2 * | 4/2015 | Hanein | B82Y 10/00 257/9 |
| 2002/0171078 A1 | 11/2002 | Eliasson et al. | |
| 2003/0034918 A1 | 2/2003 | Werner et al. | |
| 2003/0079772 A1 | 5/2003 | Gittings et al. | |
| 2003/0127641 A1 * | 7/2003 | Eliasson | B82Y 20/00 257/25 |
| 2003/0128919 A1 * | 7/2003 | Weiss | B82Y 20/00 385/25 |
| 2003/0142036 A1 | 7/2003 | Wilhelm et al. | |
| 2003/0214456 A1 | 11/2003 | Lynch | |
| 2003/0230747 A1 | 12/2003 | Ostergard | |
| 2004/0028307 A1 | 2/2004 | Diduck | |
| 2004/0201526 A1 | 10/2004 | Knowles et al. | |
| 2004/0232406 A1 * | 11/2004 | Weiss | H02S 99/00 257/35 |
| 2005/0057431 A1 | 3/2005 | Brown | |
| 2005/0247470 A1 | 11/2005 | Fleming et al. | |
| 2005/0253763 A1 | 11/2005 | Werner et al. | |
| 2006/0035073 A1 | 2/2006 | Funkenbusch et al. | |
| 2006/0061510 A1 | 3/2006 | Itsuji | |
| 2006/0092087 A1 | 5/2006 | Lange | |
| 2006/0125707 A1 | 6/2006 | Waschenko | |
| 2006/0194022 A1 | 8/2006 | Boutilier et al. | |
| 2006/0227422 A1 | 10/2006 | Monacelli et al. | |
| 2006/0231625 A1 | 10/2006 | Cumming et al. | |
| 2006/0267856 A1 | 11/2006 | Voeltzel | |
| 2007/0077688 A1 | 4/2007 | Hsu et al. | |
| 2007/0132645 A1 | 6/2007 | Ginn et al. | |
| 2007/0159395 A1 | 7/2007 | Sievenpiper et al. | |
| 2007/0170370 A1 | 7/2007 | Gorrell et al. | |
| 2007/0171120 A1 | 7/2007 | Puscasu et al. | |
| 2007/0176832 A1 | 8/2007 | Qian et al. | |
| 2007/0235658 A1 | 10/2007 | Zimdars et al. | |
| 2007/0240757 A1 | 10/2007 | Ren et al. | |
| 2008/0290822 A1 | 11/2008 | Greene et al. | |
| 2009/0121014 A1 | 5/2009 | Tharp et al. | |
| 2009/0125254 A1 * | 5/2009 | Kotter | G06F 17/5036 702/57 |
| 2010/0001587 A1 | 1/2010 | Casey et al. | |
| 2010/0276595 A1 * | 11/2010 | Kirby | G02B 5/208 250/339.02 |
| 2010/0284086 A1 * | 11/2010 | Novack | H01Q 1/248 359/580 |
| 2011/0017284 A1 | 1/2011 | Moddel | |
| 2011/0121258 A1 | 5/2011 | Hanein et al. | |
| 2011/0163920 A1 | 7/2011 | Cutler | |
| 2011/0194100 A1 | 8/2011 | Thiel et al. | |
| 2011/0277805 A1 | 11/2011 | Novack et al. | |
| 2012/0080073 A1 | 4/2012 | Kotter et al. | |
| 2013/0009851 A1 * | 1/2013 | Danesh | H01G 9/20 343/904 |
| 2013/0249771 A1 * | 9/2013 | Kotter | H01Q 1/248 343/893 |
| 2015/0303335 A1 * | 10/2015 | Kotter | G02B 5/281 250/208.2 |

OTHER PUBLICATIONS

"$1/W Photovoltaic Systems, A White Paper to Explore a Grand Challenge for Electricity from Solar," U.S. Department of Energy 2010.

Bailey, R. L. (1972). A proposed new concept for a solar-energy converter. Journal of Engineering for Power (73).

Beck et al., "Microstirp antenna coupling for quant-well infrared photodetectors," 2001, Infrared Physics and Technology, vol. 42, pp. 189-298.

Berland, B. (2003). Photovoltaic Technologies Beyond the Horizon: Optical Rectenna Solar Cell. Final report, NREL Report No. SR-520-33263.

Blackburn et al., Numerical Convergence in Periodic Method of Moments Analysis of Frequency-Selective Surfaces Based on Wire Elements, Aug. 6, 2004, IEEE, vol. 53, No. 10, pp. 3308-3315.

Brown, E. R. (2004). A System Level Analysis of Schottky diodes for incoherent THz imaging arrays. Solid State Electronics(p. 2051) vol. 48, Issue 10-11, International Semiconductor Device Research Symposium 2003.

Brown, W. (1976). Optimization of the Efficiency and Other Properties of the Rectenna Element., (pp. 142-144).

Brown, W. (1984). The History of Power Transmission by Radio Waves. Microwave Theory and Techniques, IEEE Transactions on , 32 (9), 1230-1242.

Corkish, R., Green, M. A., & Puzzer, T. (2002). Solar energy collection by antennas. Solar Energy , 73 (6), 395-401.

Dagenais, M., Choi, K., Yesilkoy, F., Chryssis, A. N., & Peckerar, M. C. (2010). Solar spectrum rectification using nano-antennas and tunneling diodes. In L. A. Eldada, & E.-H. Lee (Ed.), Proc. of SPIE. 7605, p. 76050E. SPIE.

Dale K. Kotter, Steven D. Novack, W. Dennis Slafer, and Patrick Pinhero, "Solar Nantenna Electromagnetic Collectors," ASME Conference Proceedings, vol. 2008, No. 43208, pp. 409-415, 2008.

Denholm, Paul, Drury, Easan, Margolis, Robert, "The Solar Deployment System (SolarDS) Model: Documentation and Sample Results," Technical Report NREL/TP-6A2-45832, Sep. 2009.

Eliasson, B. J. (2001). Metal-Insulator-Metal Diodes for Solar Energy Conversion. PhD Thesis, University of Colorado at Boulder, Boulder.

Frost, Greg, "BC physicists transmit visible light through miniature cable," Boston college, Public release, Jan. 8, 2007, 2 pages.

(56) References Cited

OTHER PUBLICATIONS

Fumeaux, C. Hellmann, W., et al. (1998). Nanometer thin-film Ni—NiO—Ni diodes for detection and mixing of 30 THz radiation. Infrared Physics & Technology, 39 (123-189).
Gates et al., "Unconventional Nanofabrication," Annu. Rev. Mater. Res. 2004, 34:339-72.
Gonzalez, F., & Boreman, G. D. (2005). Comparison of dipole, bowtie, spiral and log-periodic IR antennas. Infrared Physics & Technology, 46 (5), 418-428.
Goswami, D. Y., Vijayaraghavan, S., Lu, S., & Tamm, G. (2004). New and emerging developments in solar energy. Solar Energy, 76 (1-3), 33-43.
Grover, S., Dmitriyeva, 0., Estes, M. J., & Moddel, G. (2010). Traveling-Wave Metal/Insulator/Metal Diodes for Improved Infrared Bandwidth and Efficiency of Antenna-Coupled Rectifiers. Nanotechnology, IEEE Transactions on, 9 (6), 716-722.
Hartman, T. E. (1962). Tunneling of a Wave Packet. J. Appl. Phys., 33 (12), 3427-3433.
Hooberman, Benjamin, "Everything You Ever Wanted to Know About Frequency-Selective Surface Filters but Were Afraid to Ask," May 2005, pp. 1-22.
International Preliminary Report on Patentability for International Application No. PCT/US08/83142 dated May 18, 2010.
International Preliminary Report on Patentability for International Application No. PCT/US08/83143 dated May 18, 2010.
International Search Report from PCT/US08/83142 dated Jan. 9, 2009, 2 pages.
International Search Report from PCT/US08/83143 dated Jan. 9, 2009, 2 pages.
Jonietz, Erika, "Nano Antenna," Technology Review, <<http://www.technologyreview.com/Nanotech/16024/>> Dec. 2005, 5 pages.
Kale, B. M. (1985). Electron tunneling devices in optics. Optical Engineering, 24 (2), 267-274.
Kazemi, H., Shinohara, K., Nagy, G., Ha, W., Lail, B., Grossman, E., et al. (2007). First THz and IR characterization of nanometer-scaled antenna-coupled InGaAs/InP.
Kotter, Dale K., et al., "Lithographic Antennas for enhancement of solar-cell efficiency," Published Apr. 1998, 26 pages.
Kwon et al., "Efficient Method of Moments Formulation for Large PEC Scattering Problems Using Asymptotic Phasefront Extraction (APE)," IEEE Transaction on Antennas and Propagation, vol. 49, No. 4, Apr. 2001, pp. 583-591.
Landsberg, P. T. and Baruch, P. (1989). The Thermodynamics of the conversion of radiation energy in photovotaics. J. Phys., 1911-1926.
Matsumoto, Y., Hanajiri, T., Toyabe, T., .& Sugano, T. (1996). Single Electron Device with Asymmetric Tunnel Barriers. Jpn. J. Appl. Phys., 35, 1126-1131.
Mayer, A., Chung, M. S., Weiss, B. L., Miskovsky, N. M., & Cutler, P. H. (2010). Simulations of infrared and optical rectification by geometrically asymmetric metalae'vacuumaemetal junctions for applications in energy conversion devices. Nanotechnology, 21 (14), 145204.
Monacelli et al., "Infrared Frequency Selective Surface Based on Circuit-Analog Square Loop Design," IEEE Transactions on Antennas and Propagation, vol. 53, No. 2, Feb. 2005, pp. 745-752.
Nagae, M. (1972). Response Time of Metal-Insulator-Metal Tunnel Junctions. Jpn. J. Appl. Phys., 11 (11), 1611-1621.
Nanotechnology and Nanomaterials News Database, "Sunlight Antenna for Solar Cells is Focus of Research Agreement," <<www.perfectdisplay.com>> Jun. 10, 2005, 1 page.
Nanotechnology News, "Carbon Nanotube Structures Could Provide More Efficient Solar Power for Soldiers," <<http://www.azonano.com/news.asp?newsID=548>> Jun. 13, 2007, 4 pages.
Nanowerk Spotlight, "Optical antenna with a single carbon nanotube," <<http://www.nanowerk.com/spotlight/spotid=1442.php>> Jun. 13, 2007, 3 pages.
News in Science, "Light excites nano-antenna," <<http://www.abc.net.au/science/news/stories/s1202875.htm>> Sep. 20, 2004, 2 pages.
Oliveria et al. Analysis of Mocrostrip antenna array with GaAS and fenolite substrated, 2002, IEEE infrared and millimeter waves conference Digest, pp. 91-92.
Osgood, R. M., Kimball, B. R., & Carlson, J. (2007). Nanoantenna-coupled MIM nanodiodes for efficient vis/nir energy conversion. In D. R. Myers (Ed.). 6652, p. 665203. SPIE.
Panteny et al., The Frequency Dependent Permittivity and AC Conductivity of Random Electrical Networks, 2005, Ferroelectrics, 319, pp. 199-208.
Peters et al., "Method of Moments Analysis of Anisotropic Artificial Media Composed of Dielectric Wire Objects," IEEE Transactions on Microwave Theory and Techniques, vol. 43, No. 9, Sep. 1995, pp. 2023-2027.
Peters, Timothy J., "A Quasi-Interactive Graded-Mesh Generation Algorithm for Finite Element/Moment Method Analysis on NURBS-Based Geometries," IEEE 1994, pp. 1390-1393.
Pierantoni et al., "Theoretical and Numerical Aspects of the Hybrid MOM-FDTD, TLM-IE and ARB Methods for the Efficient Modelling of EMC Problems," 29th European Microwave Conference—Munich 1999, pp. 313-316.
Rahmat-Sammii et al., "Mesh Reflector Antennas with Complex Weaves: PO/Periodic MoM and Equivalent Strip Width Verification," IEEEAC paper #1547, Version 3, Updated Dec. 3, 2006, pp. 1-9.
Research Highlights, "Catching the sun's rays with wire," DOE Pulse, No. 242, Aug. 27, 2007 (2 pages).
Rockwell, S., Lim, D., Bosco, B., Baker, J., Eliasson, B., Forsyth, K., et al. (2007). Characterization and Modeling of Metal/Double-Insulator/Metal Diodes for Millimeter Wave Wireless Receiver Applications. Radio Frequency Integrated Circuits (RFIC) Symposium, IEEE, (pp. 171-174).
Sanchez, A., Davis, C. F., Liu, K. C., & Javan, A. (1978). The MOM tunneling diode: Theoretical estimate of its performance at microwave and infrared frequencies. J. Appl. Phys., 49 (10), 5270-5277.
Sarehraz, M. (2005). Novel rectenna for collection of infrared and visible radiation. PhD Thesis, University of South Florida.
Sarehraz, M., Buckle, K., Weller, T., Stefanakos, E., Bhansali, S., Goswani, Y., et al. (2005). Rectenna developments for solar energy collection., (pp. 78-81).
Science Daily, "A Sound Way to Turn Heat Into Electricity," <<http://www.sciencedaily.com/releases/2007/06/070603225026.htm>> Jun. 13, 2007, 3 pages.
Shafer, Rachel, "Thermoelectrics: A matter of material," Innovations—Research and News from Berkeley Engineering. vol. 4, Issue 5, Jun. 2010.
Strassner, B. H., & Chang, K. (2005). Rectifying Antennas (Rectennas). In Encyclopedia of RF and Microwave Engineering (p. 4418). John Wiley & Sons.
Wang et al., "Receiving and transmitting light-like radio waves: Antenna effect in arrays of aligned carbon nanotubes," Applied Physics Letters, vol. 85, No. 13, Sep. 27, 2004, pp. 2607-2609.
Written Opinion of the International Searching Authority from PCT/US08/83142 dated Jan. 9, 2009, 6 pages.
Written Opinion of the International Searching Authority from PCT/US08/83143 dated Jan. 9, 2009, 7 pages.
European Search Report from European Patent Application No. 13763632.0 dated Oct. 29, 2015, 6 pages.
Huo. A Terahertz Radiation Detection System Design and Device Modeling. 2003. [retrieved on Dec. 30, 2013]. Retrieved from ProQuest Dissertations and Theses: <URL: http://search.proquest.com/docview/305342595/fulltextPDF/142AC395157 4EAC6EE0/4?accountid=142944>. pp. 1-220.
PCT International Search Report and Written Opinion of the International Searching Authority for PCT/US2013/049932, dated Jan. 31, 2014, 10 pages.
International Preliminary Report on Patentability for International Application No. PCT/US2013/049932 dated Mar. 3, 2015, 8 pages.

\* cited by examiner

ENERGY HARVESTING DEVICES, SYSTEMS, AND RELATED METHODS

GOVERNMENT RIGHTS

This invention was made with government support under Contract Number DE-AC07-05ID14517 awarded by the United States Department of Energy. The government has certain rights in the invention.

CROSS-REFERENCE TO RELATED APPLICATIONS

This application is related to U.S. patent application Ser. No. 13/311,874, filed Dec. 6, 2011, which issued as U.S. Pat. No. 8,338,772 on Dec. 25, 2012, which is a continuation of U.S. patent application Ser. No. 11/939,342, filed Nov. 13, 2007, which issued as U.S. Pat. No. 8,071,931 on Dec. 6, 2011. This application is also related to U.S. patent application Ser. No. 13/179,329, filed Jul. 8, 2011, which issued as U.S. Pat. No. 8,283,619 on Oct. 9, 2012, which is a divisional of U.S. patent application Ser. No. 11/939,342, filed Nov. 13, 2007, which issued as U.S. Pat. No. 8,071,931 on Dec. 6, 2011. The disclosures of each of the above-referenced applications are incorporated by reference herein in their entireties.

TECHNICAL FIELD

Embodiments of the present disclosure relate to energy harvesting devices and systems and methods of forming such devices and systems. In particular, embodiments of the present disclosure relate to energy harvesting devices and systems with resonance elements formed in a substrate for absorbing and reradiating incident electromagnetic radiation.

BACKGROUND

Conventionally, energy harvesting techniques and systems are focused on renewable energy such as solar energy, wind energy, and wave action energy. Solar energy is conventionally harvested by arrays of solar cells, such as photovoltaic cells, that convert radiant energy to DC power. Such radiant energy collection is limited in low-light conditions such as at night or even during cloudy or overcast conditions. Conventional solar technologies are also limited with respect to the locations and orientations of installment. For example, conventional photovoltaic cells are installed such that the light of the sun strikes the photovoltaic cells at specific angles such that the photovoltaic cells receive relatively direct incident radiation. Expensive and fragile optical concentrators and mirrors are conventionally used to redirect incident radiation to the photovoltaic cells to increase the efficiency and energy collection of the photovoltaic cells. Multi-spectral bandgap engineered materials and cascaded lattice structures have also been incorporated into photovoltaic cells to improve efficiency, but these materials and structures may be expensive to fabricate. Multiple-reflection and etched-grating configurations have also been used to increase efficiency. Such configurations, however, may be complex and expensive to produce, and may also reduce the range of angles at which the solar energy can be absorbed by the photovoltaic cells.

Additionally, conventional photovoltaic cells are relatively large. As a result, the locations where the photovoltaic cells can be installed may be limited. As such, while providing some utility in harvesting energy from the electromagnetic radiation provided by the sun, current solar technologies are not yet developed to take full advantage of the potential electromagnetic energy available. Further, the apparatuses and systems used in capturing and converting solar energy are not particularly amenable to installation in numerous locations or situations.

Moreover, conventional commercial photovoltaic cells typically have an efficiency of about 15%, expressed as a percentage of available solar electromagnetic radiation that is converted to electricity by the photovoltaic cells. Conventional photovoltaic cells are presently limited to collection of energy in a very narrow band of light (e.g., approximately 0.8 to 0.9 micrometer ($\mu$m) wavelengths). The spectrum of potentially available electromagnetic energy is much greater than the narrow band in which conventional photovoltaic cells operate. For example, electromagnetic energy provided by the sun falls within the wavelength spectrum of approximately 0.1 $\mu$m to approximately 6 $\mu$m. Additionally, energy absorbed by the earth and reradiated (e.g., at night) falls within the wavelength spectrum of approximately 3 $\mu$m to approximately 70 $\mu$m. Current energy harvesting technologies fail to take advantage of such available energy.

Conventional photovoltaic cells may be formed of silicon material. Silicon is an indirect bandgap material that requires film thicknesses that are difficult to fabricate as mechanically stable films. Thick amorphous silicon films have been shown to degrade when exposed to sunlight. However, greater absorption efficiency is obtained for increased material thickness. Therefore, there is a tradeoff in an amorphous silicon photovoltaic cell design between high material thicknesses having high efficiency and a short lifetime or low material thicknesses with low efficiency and a long lifetime. Crystalline silicon in photovoltaic cells experiences less degradation in sunlight, but is more expensive to produce than amorphous silicon.

Turning to another technology, frequency selective surfaces (FSS) are used in a wide variety of applications including radomes, dichroic surfaces, circuit analog absorbers, and meanderline polarizers. An FSS is a two-dimensional periodic array of electromagnetic antenna elements. Such antenna elements may be in the form of, for example, conductive dipoles, loops, patches, slots or other antenna elements. An FSS structure generally includes a metallic grid of antenna elements deposited on a dielectric substrate. Each of the antenna elements within the grid defines a receiving unit cell.

An electromagnetic wave incident on the FSS structure will pass through, be reflected by, or be absorbed by the FSS structure. This behavior of the FSS structure generally depends on the electromagnetic characteristics of the antenna elements, which can act as small resonance elements. As a result, the FSS structure can be configured to perform as low-pass, high-pass, or dichroic filters. Thus, the antenna elements may be designed with different geometries and different materials to generate different spectral responses.

Conventionally, FSS structures have been successfully designed and implemented for use in Radio Frequency (RF) and microwave frequency applications. As previously discussed, there is a large amount of renewable electromagnetic radiation available that has been largely untapped as an energy source using currently available techniques. For instance, radiation in the ultraviolet (UV), visible, and infrared (IR) spectra are energy sources that show considerable potential. However, the scaling of existing FSS structures or other similar structures for use in harvesting such potential energy sources comes at the cost of reduced gain for given frequencies.

Additionally, scaling FSS structures or other transmitting or receptive structures for use with, for example, the IR or near IR (NIR) spectra presents numerous challenges due to the fact that materials do not behave in the same manner at the so-called "nano-scale" as they do at scales that enable such structures to operate in, for example, the radio frequency (RF) spectra. For example, materials that behave homogeneously at scales associated with the RF spectra often behave non-homogeneously at scales associated with the IR or NIR spectra.

The inventor has appreciated the need for improving upon existing technologies and to provide methods, structures and systems associated with harvesting energy including structures, methods and systems that provide access to greater bands of the electromagnetic spectrum and, thus, greater access to available, yet-unused energy sources.

DETAILED DESCRIPTION

Figure 1:
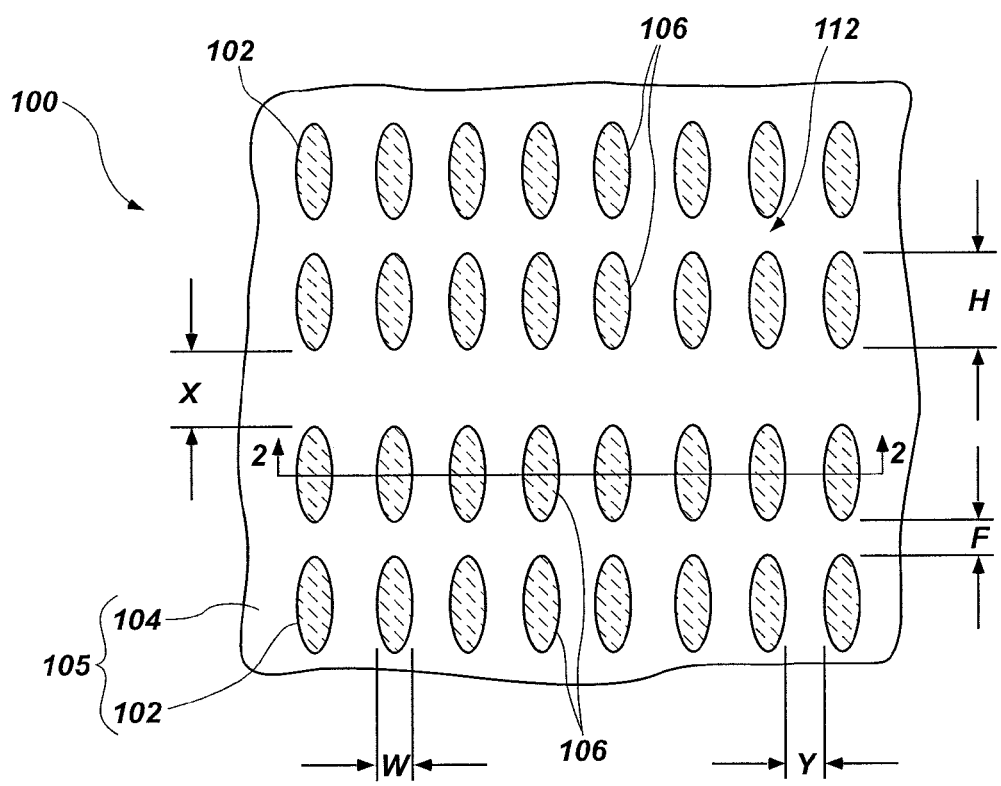
FIG. 1 is a partial plan view of an energy harvesting device according to an embodiment of the present disclosure.

In the following detailed description, reference is made to the accompanying drawings which form a part hereof, and in which is shown by way of illustration specific embodiments of the present disclosure. These embodiments are described with specific details to clearly describe the embodiments of the present disclosure. However, the description and the specific examples, while indicating examples of embodiments of the present disclosure, are given by way of illustration only and not by way of limitation. Other embodiments may be utilized and changes may be made without departing from the scope of the disclosure. Various substitutions, modifications, additions, rearrangements, or combinations thereof may be made and will become apparent to those of ordinary skill in the art. In addition, features from one embodiment may be combined with features of another embodiment while still being encompassed within the scope of the disclosure as contemplated by the inventor.

It should be understood that any reference to an element herein using a designation such as "first," "second," and so forth does not limit the quantity or order of those elements, unless such limitation is explicitly stated. Rather, these designations may be used herein as a convenient method of distinguishing between two or more elements or instances of an element. Thus, a reference to first and second elements does not mean that only two elements may be employed or that the first element must precede the second element in some manner. In addition, unless stated otherwise, a set of elements may comprise one or more elements.

Embodiments of the present disclosure include methods, devices, and systems for harvesting energy from electromagnetic radiation including, for example, harvesting energy from radiation in the IR, NIR, mid IR (MIR), far IR (FIR), and visible light spectra.

Nano electromagnetic concentrator (NEC) structures may include an array or other periodic arrangement of resonant elements, which also may be referred to as antennas, microantennas, nanoantennas, and nanoparticles. NEC structures may include, but are not limited to, FSS structures. Generally, the NEC structures may be formed by a conductive material formed in a specific pattern on a dielectric substrate to create the resonance elements. These NEC structures may be used for spectral modification of reflected or transmitted incident radiation. The resonant properties of these NEC structures are largely dependent on the NEC structure's layout in terms of shape, dimensions, periodicity, the structure's material properties, and optical parameters of surrounding media. It has been demonstrated that by varying the NEC geometry, material properties, or combinations thereof, the resonance of an NEC structure may be tuned to meet specific design requirements. However, as previously noted, attempts to scale NEC structures for use in, for example, the IR, NIR, MIR, FIR, and visible light spectra have posed particular problems because of the non-homogeneous behavior of materials at the scales necessary to function at such wavelengths and frequencies.

Figure 2:
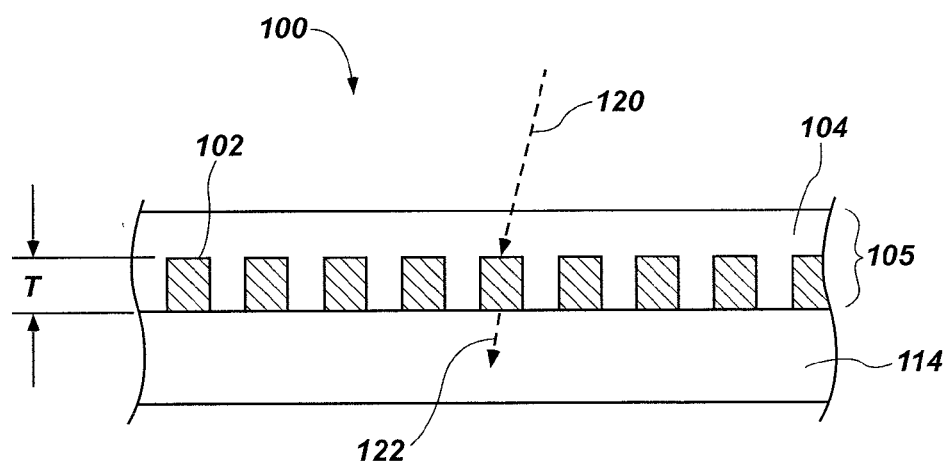
FIG. 2 is a partial cross-sectional view of the energy harvesting device of FIG. 1.
Figure 3:
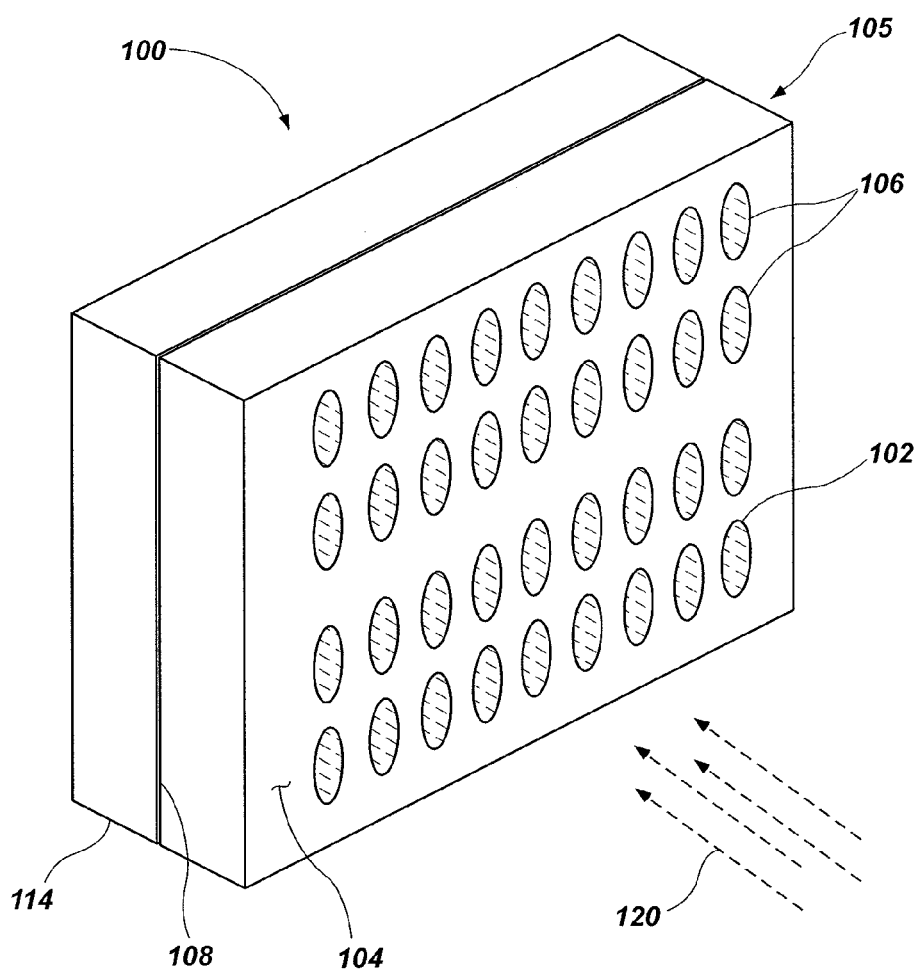
FIG. 3 is a partial perspective view of the energy harvesting device of FIG. 1.

FIGS. 1 through 3 illustrate different views of an energy harvesting device 100 useful in the harvesting of electromagnetic radiation according to an embodiment of the present disclosure. In particular, FIG. 1 is a partial plan view of the energy harvesting device 100, FIG. 2 is a partial cross-sectional view of the energy harvesting device 100, and FIG. 3 is a partial perspective view of the energy harvesting device 100. The energy harvesting device 100 may include an array of resonance elements 102 (e.g., nanoantennas, nanoparticles) arranged in a substrate 104. The substrate 104 may be coupled to (e.g., overlay, be laminated to, be bonded to) a photovoltaic (PV) material 114. The resonance elements 102 and the substrate 104 may be referred to collectively as an NEC structure 105.

The resonance elements 102 may be formed of an electrically conductive material. The electrically conductive material of the resonance elements 102 may include, for example, one or more of manganese (Mn), gold (Au), silver (Ag), copper (Cu), aluminum (Al), platinum (Pt), nickel (Ni), iron (Fe), lead (Pb), carbon (C), and tin (Sn), or any other suitable electrically conductive material. In one embodiment, the conductivity of the electrically conductive material used to form the resonance elements 102 may be from approximately $1.0 \times 10^6$ Ohms$^{-1}$-cm$^{-1}$ to approximately $106.0 \times 10^6$ Ohms$^{-1}$-cm$^{-1}$.

The substrate 104 of the NEC structure 105 may include a semiconductor material. As non-limiting examples, the substrate 104 may include a semiconductor-based material including, for example, at least one of silicon, silicon-on-insulator (SOI), silicon-on-sapphire (SOS), doped and undoped semiconductor materials, epitaxial layers of silicon supported by a base semiconductor foundation, and other semiconductor materials. In addition, the semiconductor material need not be silicon-based, but may be based on silicon-germanium, germanium, or gallium arsenide, among others. The semiconductor material may be crystalline (e.g., monocrystalline or polycrystalline) or amorphous solids, for example.

Alternatively or additionally, the substrate 104 may comprise a dielectric material. For example, the substrate 104 may comprise a flexible material selected to be compatible with energy transmission of a desired wavelength, or range of wavelengths, of electromagnetic radiation (i.e., light). The substrate 104 may be formed from a variety of flexible materials such as a thermoplastic polymer or a moldable plastic. For example, the substrate 104 may comprise polyethylene, polypropylene, acrylic, fluoropolymer, polystyrene, poly methylmethacrylate (PMMA), polyethylene terephthalate (MYLAR®), polyimide (e.g., KAPTON®), polyolefin, or any other material chosen by one of ordinary skill in the art. In additional embodiments, the substrate 104 may comprise a binder with nanoparticles distributed therein, such as silicon nanoparticles distributed in a polyethylene binder, or ceramic nanoparticles distributed in an acrylic binder. Any type of substrate 104 may be used that is compatible with the transmission of electromagnetic radiation of an anticipated wavelength.

In one embodiment, the energy harvesting device 100 may include a substrate 104 formed of polyethylene with the resonance elements 102 formed of aluminum. It is noted that the use of polyethylene (or other similar material) as a substrate 104 provides the NEC structure 105 with flexibility such that it may be mounted and installed on a variety of surfaces and adapted to a variety of uses.

The PV material 114, shown in FIGS. 2 and 3, may include, for example, commercially available PV materials. By way of example and not limitation, the PV material 114 may include one or more of a silicon material (e.g., crystalline silicon, amorphous silicon, thin-film silicon, etc.), a bandgap engineered material (e.g., a silicon material with multiple p-n junctions for absorbing energy at different wavelengths), a polymer material (e.g., an organic semiconductor material), etc. The NEC structure 105 including the substrate 104 and resonance elements 102 may be coupled to the PV material 114, such as by being overlaid thereon or laminated, or bonded thereto. For example, an adhesion material 108 (FIG. 3) may be used to bond the NEC structure 105 to the PV material 114. The resonance elements 102 may, in some embodiments, be capacitively coupled (e.g., no direct wiring) to the PV material 114. The NEC structure 105 may serve as a protective top coat for the PV material 114 underlying the NEC structure 105. As noted above, PV materials including silicon may degrade over time when exposed to electromagnetic radiation. The NEC structure 105 may reduce such degradation and provide environmental protection for the PV material 114.

Due to the increased efficiency in absorption of solar energy by use of the NEC structure 105, as described in more detail below, the PV material 114 may, in some embodiments, have a thickness that is less than conventional PV materials. Therefore, the PV material 114 may be formed by thin-film deposition technologies. By way of example and not limitation, the PV material 114 may be formed by one or more of imprint lithography (e.g., nanoimprint lithography, hot embossing), physical vapor deposition (PVD), chemical vapor deposition (CVD), and spin coating. For example, one or more of DC sputtering, DC magnetron sputtering, RF sputtering, reactive PVD, and plasma-enhanced CVD may be used in the formation of the PV material 114. In some embodiments, the PV material 114 of the present disclosure may have a thickness of about 50 μm or less. By way of another example, the PV material 114 may have a thickness of about 10 μm. However, the present disclosure also encompasses a PV material 114 having a conventional thickness (e.g., about 250 μm to about 380 μm). Therefore, the present disclosure is not limited to a PV material 114 of a particular thickness. Regardless of the thickness of the PV material 114, the NEC structure 105 may improve the efficiency of an energy harvesting device 100 including the associated PV material 114.

During operation of the energy harvesting device 100, the energy harvesting device 100 may be exposed to incident radiation 120, such as radiation provided by the sun. The resonance elements 102 may absorb the incident radiation 120 and electromagnetically resonate to provide reradiated energy 122 to the PV material 114, as shown in FIG. 2. The resonance elements 102 may be configured to absorb radiation at a range of frequencies to which the apparatus is exposed (e.g., radiation provided by the sun, thermal energy radiated by the earth, etc.). The range of radiation frequency absorbed by the resonance elements 102 may be tailored by, for example, altering the geometry of the resonance elements 102 and/or of an array of resonance elements 102, as will be described in more detail below. By way of example and not limitation, the resonance elements 102 may be configured to resonate at a frequency in one of the IR, NIR, MIR, FIR, or visible light spectra. In some embodiments, the resonance elements 102 may be configured to absorb radiation having a frequency of between approximately 0.1 Terahertz (THz) and approximately 1,000 THz (i.e., at wavelengths between about 0.3 μm and about 3 mm), which corresponds generally to the visible to FIR spectrum. In some embodiments, at least some of the resonance elements 102 may be configured to absorb incident radiation 120 having a frequency of between approximately 0.1 THz and approximately 30 THz (i.e., at wavelengths between about 10 μm and about 3 mm), which corresponds generally to the MIR to FIR spectrum.

The electromagnetic behavior (e.g., resonance) of the resonance elements 102 may be affected by near-field effects of media proximate the resonance elements 102, such as the substrate 104. For example, the resonance and bandwidth of the resonance elements 102 may be a partial function of impedance of the substrate 104. As mentioned above, the substrate 104 may be a dielectric material, a semiconductor material, or a combination of a dielectric material and a semiconductor material. Resonance of the resonance elements 102 induced by the incident radiation 120 may include both electric field and magnetic field components and may be affected by phase and polarization of the incident radiation 120. Using a dielectric material as a portion of the substrate 104 or as the entire substrate 104 may improve electrostatic performance of the resonance elements 102. Using a semiconductor material as a portion of the substrate 104 or as the entire substrate 104 may improve electron flow. Responsivity of the resonance elements 102 may be tailored while controlling the complex impedance to ensure proper energy transfer to a load by selecting an appropriate material for the substrate 104. In some embodiments, the load may be a diode, which may exhibit a frequency-dependent reactance. Doping of the substrate 104 may be performed to add inductive reactance to the resonance elements 102 and to cancel out capacitive reactance of the diode, thus further tailoring the electromagnetic behavior of the resonance elements 102.

A dielectric material is an electrical insulator that can be polarized by an applied electric field. A dielectric material is a substance that is generally a poor conductor of electricity, but an efficient supporter of electrostatic fields. A dielectric material is generally able to support an electrostatic field while dissipating a relatively low amount of energy in the form of heat. These properties may be used to tailor the overall electromagnetic field (e.g., the shape, intensity, etc., of the electromagnetic field) of the resonance elements 102. Various dielectric materials may be used in the substrate 104 to impact the electric permittivity and the overall electric susceptibility of the resonance elements 102.

The difference between semiconductor materials and dielectric materials is quantitative. In other words, materials exhibiting a band gap containing a Fermi level narrower than about 4 eV are usually referred to as semiconductor materials, while materials with wider band gaps are usually referred to as dielectric materials. The ease with which electrons in semiconductor materials can be excited from a valence band to a conduction band depends on the band gap of the materials. Behavior of semiconductor materials can be manipulated by the addition of impurities, known in the art as "doping." Conduction of electrical current in a semiconductor occurs via mobile or so-called "free" electrons and holes, which are collectively known as charge carriers.

Semiconductor materials are generally more thermally rugged than dielectric materials, and may, therefore, be used as the substrate 104 in some high temperature applications, such as high quality waste heat harvesting. However, fabrication of semiconductor materials may involve more expensive processes, such as e-beam lithography. On the other hand, dielectric materials may be formed by relatively low cost manufacturing processes, such as imprint lithography. Therefore, dielectric materials may be used as the substrate 104 in some low temperature applications and large-scale deployments.

The resonance elements 102 and the array thereof may be configured to provide reradiated energy 122 (FIG. 2) at the bandgap energy of the PV material 114. For example, if the particular PV material 114 most efficiently absorbs radiation having a wavelength (i.e., has a bandgap energy) in a range of about 0.8 µm to about 0.9 µm, the resonance elements 102 may be configured provide reradiated energy 122 at a wavelength within the range of about 0.8 µm to about 0.9 µm. Therefore, the resonance elements 102 may absorb energy (e.g., incident radiation 120) having a wide range of wavelengths and electromagnetically oscillate to induce surface currents, or in other words, reradiate the energy (as reradiated energy 122) at a wavelength that may be efficiently absorbed and converted into electricity by the PV material 114. The reradiated energy 122 may cause electron-hole transfer in the PV material 114 and initiate an energy conversion process to produce electricity. In other words, electromagnetic waves (e.g., in the solar spectrum) may be received by the resonance elements 102, which induces current into the underlying PV material 114. Conventional methods used to collect, store, and/or use energy (e.g., DC energy) from the PV material 114 may then be implemented.

The NEC structure 105 may be configured to absorb the incident radiation 120 and reradiate the energy (as reradiated energy 122) at the desired wavelengths by altering the material, shape, pattern, and dimensions of the resonance elements 102 and an array thereof. The dimensions and array pattern of the resonance elements 102 of the energy harvesting device 100 may vary depending on, for example, the frequency at which the resonance elements 102 are intended to resonate and the materials used to form the various components of the energy harvesting device 100. In some embodiments, each resonance element 102 may be formed in the substrate 104 as a discrete element with no wiring or other direct electrical connection to other resonance elements 102 in the array.

In the embodiment described with respect to FIGS. 1 through 3, each of the resonance elements 102 is shown as an oval or an ellipse. However, the resonance elements 102 may exhibit other geometries and the example embodiments described herein are not to be taken as limiting with respect to such potential geometries. As non-limiting examples, such geometries may include circular loops, square loops, square spirals, circular spirals, dipoles, bowties, triangles, slots, lines, rectangles, crosses, and other polygonal shapes. The resonance elements 102 may be arranged in groups of two or more resonance elements 102. Such groups may have a configuration of, for example, dipole, tripole, bowtie, concentric loops, etc. Moreover, a particular energy harvesting device 100 may include numerous different geometries of resonance elements 102 and groups thereof formed on or in the substrate 104. As shown in FIG. 2, the resonance elements 102 may be at least partially disposed within the substrate 104.

One embodiment having a particular geometry and set of dimensions will be described with reference to FIGS. 1 and 2, in which the individual resonance elements 102 are in the shape of ellipses (i.e., ovals) arranged in pairs 106 (e.g., dipole pairs). The resonance elements 102 may be arranged such that a feed gap 112 is formed between the resonance elements 102 of each pair 106. Each ellipse may have a minor axis width W in a range of approximately 10 nm to approximately 50 nm, such as about 30 nm, and a major axis height H in a range of approximately 40 nm to approximately 80 nm, such as about 60 nm. Each pair 106 may have a feed gap distance F in a range of approximately 20 nm to approximately 60 nm, such as about 30 nm, between associated resonance elements 102 of each pair 106. A longitudinal distance X between adjacent pairs 106 may be in a range of approximately 30 nm to approximately 70 nm, such as about 50 nm. A lateral distance Y between adjacent pairs 106 may be in a range of approximately 20 nm to approximately 40 nm, such as about 30 nm. A thickness T of each resonance element 102 may be in a range of approximately 30 nm to approximately 100 nm, such as about 50 nm.

Although the energy harvesting device 100 has been described with reference to FIGS. 1 and 2 having a particular set of dimensions and geometries, various geometries and dimensions of components of the energy harvesting device 100 may be used according to the particular application of the energy harvesting device 100. The dimensions and geometries of the components of the energy harvesting device 100 may be determined, for example, using appropriate mathematical modeling techniques. Generally, the transmission spectra at which the energy harvesting device 100 will collect (i.e., harvest) energy and the resonant frequency or frequencies of the energy harvesting device 100 may be determined, in part, by the size, shape, and spacing of the resonance elements 102 and by properties of the particular conductive material forming the resonance elements 102. The pattern of resonance elements 102 may be altered to capture varying frequencies of electromagnetic radiation. For example, methods of analyzing structures and components that may be used as an NEC device (such as the energy harvesting device 100 of the presently described embodiments) and determining the response of such structures may use, in one example, a Periodic Method of Moments (PMM) analysis. Such a PMM analysis may take into consideration a number of different variables, such as anticipated operational frequencies, material properties, and component dimensions, as is known in the art.

As shown in FIG. 2, the NEC structure 105 may be oriented such that incident radiation 120 may enter the substrate 104 before reaching the resonance elements 102. In other embodiments, the resonance elements 102 may be substantially on an exterior surface of the substrate 104, such that at least some of the incident radiation 120 may reach the resonance elements 102 without first entering the substrate 104. Either such orientation of the NEC structure 105 relative to the PV material 114 may improve efficiency and radiation absorption of the underlying PV material 114, as noted above. However, an NEC structure 105 oriented such that incident radiation 120 enters the substrate 104 before reaching the resonance elements 102 (as shown in FIG. 2) may more efficiently capture the incident radiation 120. For example, it has been experimentally shown that the NEC structure 105 may have a stronger reception of incident radiation 120, by a factor of about forty, when the incident radiation 120 passes through at least a portion of the substrate 104 before reaching the resonance elements 102. In addition, the effective collection area may be at least two orders of magnitude larger than the photo-active region.

The energy harvesting device 100 may be manufactured using a variety of techniques including a variety of semiconductor fabrication techniques, nanofabrication techniques, and other processes, as will be recognized by those of ordinary skill in the art depending, in part, on the materials used to form the energy harvesting device 100. For example, in an embodiment wherein the substrate 104 comprises a semiconductor-based material (e.g., silicon, germanium, silicon-germanium, gallium arsenide, etc.), the substrate 104 may be selectively etched using conventional lithography, as is known in the art, to form a pattern in the desired shape of the resonance elements 102. The etched portions of the substrate 104 may be filled with a conductive material to form the resonance elements 102. By way of another example, in an embodiment wherein the substrate 104 comprises a flexible material (e.g., a thermoplastic polymer, a moldable plastic, etc.), the resonance elements 102 may be formed in the substrate 104 by imprint lithography. For example, a template may be used to form recesses in a heated substrate 104 corresponding to the desired geometry and pattern of the resonance elements 102. After cooling and removal of the template, conductive material may be formed in the recesses in the substrate 104 to form the resonance elements 102. The conductive material of the resonance elements 102 may be formed by, for example, PVD (e.g., sputtering, etc.), CVD (e.g., plasma-enhanced CVD, low pressure CVD, etc.), or any other appropriate technique chosen by one of ordinary skill in the art for forming a conductive material on a substrate. The resulting NEC structure 105 may then be coupled to the PV material 114.

In some embodiments, the energy harvesting device 100 may include individual or groups of resonance elements 102 having different sizes and/or configurations. For example, a first portion of the resonance elements 102 may have a geometry as described above for absorbing energy in a first range of wavelengths. A second portion of the resonance elements 102 may have a different geometry for absorbing energy in a second range of wavelengths. For example, the second portion of resonance elements 102 may be an array of resonance elements 102 with relatively larger geometries for harvesting energy having a higher wavelength and/or for reradiating the energy at a different wavelength than the first portion of resonance elements 102. In addition, the second portion of resonance elements 102 may have a different shape than the first portion of resonance elements 102. For example, the first portion of resonance elements 102 may include individual elements having an elliptical shape, while the second portion of resonance elements 102 may include individual elements having another shape, such as square, spiral, bowtie, triangular, rectangular, etc. The first and second portions of resonance elements 102 may be configured to absorb the incident radiation 120 at different frequencies. For example, in one embodiment, the first portion of resonance elements 102 may be configured to absorb incident radiation 120 at a frequency associated with visible light, while the second portion of resonance elements 102 may be configured to absorb incident radiation 120 at frequencies associated with what may be referred to as "long wavelength IR." Thus, the two portions of resonance elements 102 may provide the ability to simultaneously harvest energy at multiple, substantially different frequencies, or to harvest energy at substantially different frequencies at different times based on changes in radiation conditions.

In embodiments including resonance elements 102 of different sizes and/or configurations, the first and second portions of resonance elements 102 may be located in the same or otherwise co-planar substrate adjacent to each other.

Figure 4:
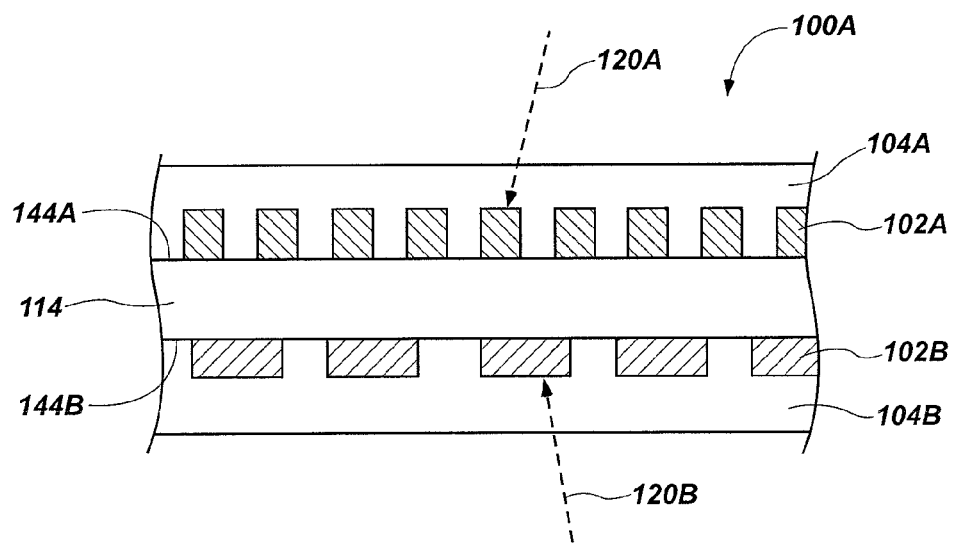
FIG. 4 is a partial cross-sectional view of another embodiment of an energy harvesting device according to an embodiment of the present disclosure.

FIG. 4 is a partial cross-sectional view of an energy harvesting device 100A according to an embodiment of the present disclosure. The energy harvesting device 100A includes a first portion of resonance elements 102A having a first configuration, and a second portion of resonant elements 102B having a second configuration. The first portion of resonant elements 102A may be formed in a first substrate 104A and positioned on a first side 144A of the PV material 114, substantially as described above with reference to FIGS. 1 through 3. The first portion of resonance elements 102A may be configured to absorb incident electromagnetic radiation 120A having a first wavelength or range of wavelengths, such as radiation provided by the sun. The second portion of resonance elements 102B having a second configuration may be formed in a second substrate 104B and positioned on a second side 144B of the PV material 114 opposite the first side 144A. The second portion of resonance elements 102B may be configured to absorb incident electromagnetic radiation 120B having a second wavelength or range of wavelengths that is different than the first wavelength or range of wavelengths, such as thermal radiation from a heated material, such as the earth. Both the first portion of resonance elements 102A and the second portion of resonance elements 102B may be configured to electromagnetically oscillate and reradiate energy at a bandgap energy of the PV material 114, as explained above.

Figure 5:
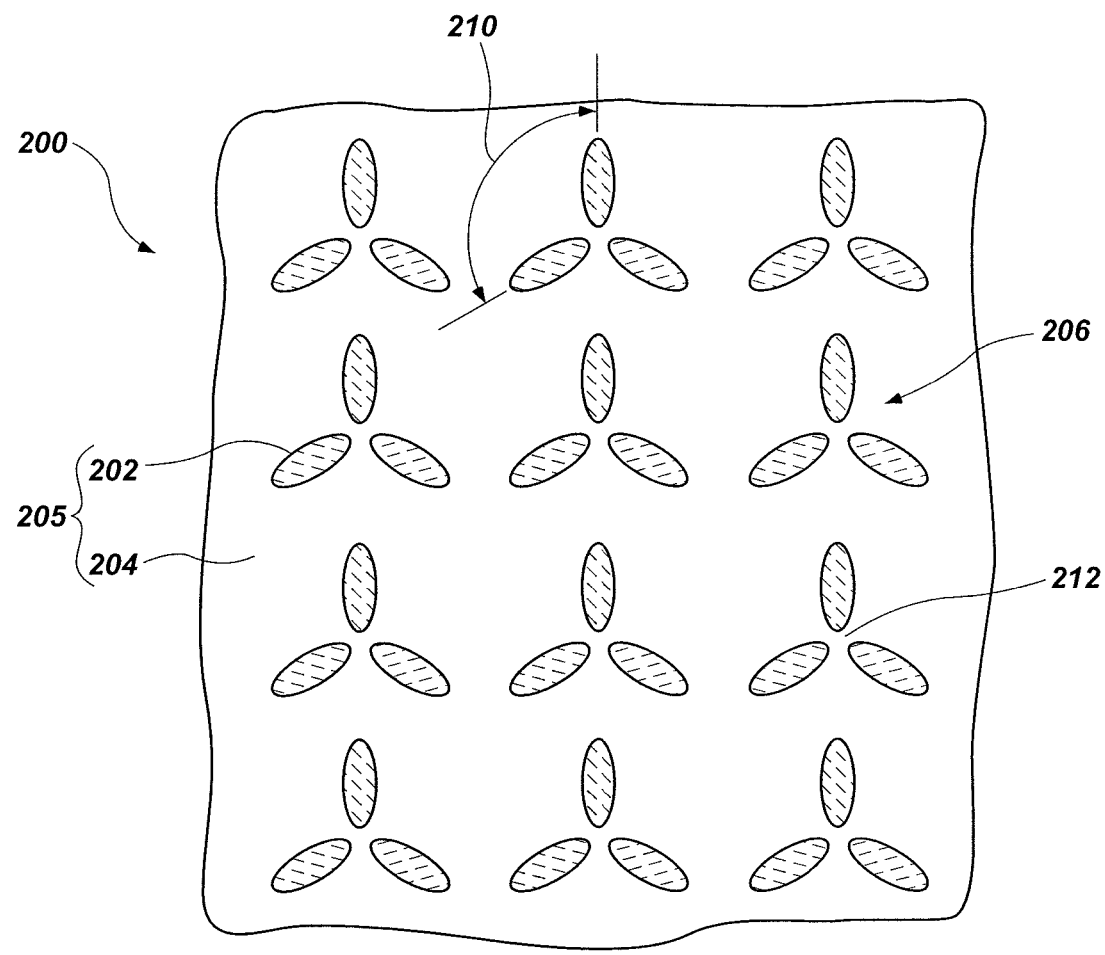
FIG. 5 is a partial plan view of an energy harvesting device according to an embodiment of the present disclosure.

FIG. 5 is a partial plan view of an energy harvesting device 200 according to an embodiment of the present disclosure. The energy harvesting device 200 may be useful in the harvesting of electromagnetic radiation, such as solar energy. The energy harvesting device 200 may be similar to the energy harvesting device 100 of FIGS. 1 through 3 in that the energy harvesting device 200 includes resonance elements 202 formed in a substrate 204, which may be collectively referred to as an NEC structure 205. The substrate 204 may include materials as described above with reference to the substrate 104 (FIGS. 1-3). The resonance elements 202 may include materials as described above with reference to the resonance elements 102 (FIGS. 1-3). Each resonance element 202 may have approximately the same shape and dimensions described above with reference to the resonance elements 102, or may have a different shape and dimensions. The NEC structure 205 may also be coupled to a PV material (not shown in FIG. 5). The energy harvesting device 200 may be formed by the same techniques described above with reference to the energy harvesting device 100. However, the energy harvesting device 200 of FIG. 5 may differ from the energy harvesting device 100 of FIGS. 1 through 3 at least in the arrangement of the resonance elements 202 relative to one another.

The energy harvesting device 200 includes groups of resonance elements arranged in an array of tripoles 206. Each tripole 206 may include three resonance elements 202 each extending longitudinally from a feed gap 212. An angle 210 between each resonance element 202 and an adjacent resonance element 202 in each tripole 206 may be approximately 120 degrees. Although each tripole 206 is shown to be oriented in the same direction (i.e., with one of the resonance elements 202 pointing up when viewed in the perspective of FIG. 5), in other embodiments, the energy harvesting device 200 may include tripoles 206 in multiple orientations relative to one another.

The energy harvesting device 200 (of FIG. 5) including resonance elements 202 arranged in tripoles 206 may enable harvesting of energy that is not as dependent on a polarization of incident radiation when compared to the energy harvesting device 100 (of FIGS. 1-3) including resonance elements arranged in dipole pairs 106. As each of the resonance elements 102 is oriented in the same direction in the energy harvesting device 100, the energy harvesting device 100 may absorb the incident radiation 120 most efficiently when the incident radiation 120 has a particular polarization (e.g., longitudinally aligned with the resonance elements 102). Conversely, the energy harvesting device 100 may not as effectively absorb the incident radiation 120 having another, substantially different polarization. Therefore, the effectiveness of the energy harvesting device 100 with dipole pairs 106 may be at least partially dependent on the polarization of the incident radiation 120. However, the resonance elements 202 of the tripoles 206 of the energy harvesting device 200 may efficiently absorb radiation at multiple polarizations due to the multiple orientations of the resonance elements 202. Therefore, the efficiency of the energy harvesting device 200 including tripoles 206 may be less polarization-dependent than the efficiency of the energy harvesting device 100 including dipole pairs 106.

Figure 6:
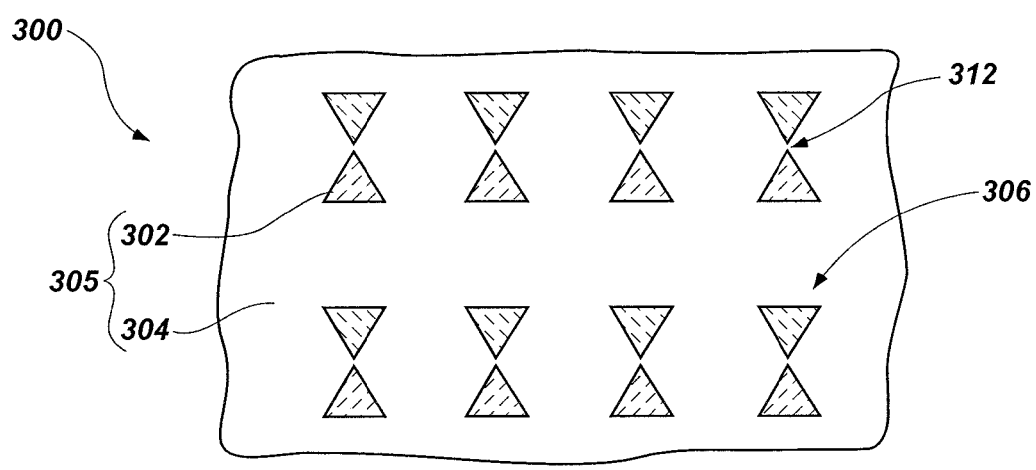
FIG. 6 is a partial plan view of an energy harvesting device according to an embodiment of the present disclosure.

FIG. 6 is a partial plan view of an energy harvesting device 300 according to an embodiment of the present disclosure. The energy harvesting device 300 may be useful in the harvesting of electromagnetic radiation, such as solar energy. The energy harvesting device 300 may be similar to the energy harvesting devices 100 (FIGS. 1-3) and 200 (FIG. 5) described above in that the energy harvesting device 300 includes resonance elements 302 formed in a substrate 304, which may be collectively referred to as an NEC structure 305. The substrate 304 may include materials as described above with reference to the substrate 104 (FIGS. 1-3). The resonance elements 302 may include materials as described above with reference to the resonance elements 102 (FIGS. 1-3). The NEC structure 305 may also be positioned over a PV material (not shown in FIG. 6). The energy harvesting device 300 may be formed by the same techniques described above with reference to the energy harvesting device 100. However, each resonance element 302 may have a different shape and dimensions than the resonance elements 102, 202 described above. As shown in FIG. 6, each resonance element 302 may be generally triangular, and the resonance elements 302 may be arranged in groups to form bowties 306. The two generally triangular resonance elements 302 of each bowtie 306 may each have an apex directed to a feed gap 312. Resonance elements 302 having such a configuration may absorb radiation at a variety of wavelengths and concentrate reradiated energy toward the feed gap 312.

Although the embodiments described above include groups of resonance elements 102, 202, 302 arranged in dipole pairs 106, tripoles 206, and bowties 306, the present disclosure is not so limited. Devices for harvesting electromagnetic radiation may include an array of resonance elements arranged periodically as single resonance elements or in other groups of two or more resonance elements. The devices having an array of resonance element may include solar panels. As a result, the need for optical concentrators and mirrors that may be used by conventional solar panels may be eliminated. Such solar panels may be implemented in a variety of different uses, such as in the commercial solar industry, space applications (e.g., satellites, space station, etc.), as well as other uses as would be appreciated by one skilled in the art.

Figure 7:
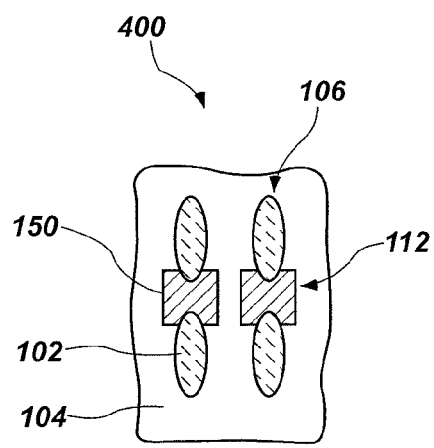
FIG. 7 is a partial plan view of an energy harvesting device according to an embodiment of the present disclosure.
Figure 8:
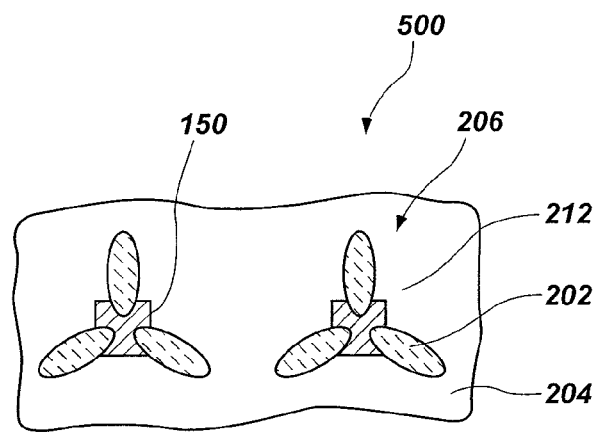
FIG. 8 is a partial plan view of an energy harvesting device according to an embodiment of the present disclosure.
Figure 9:
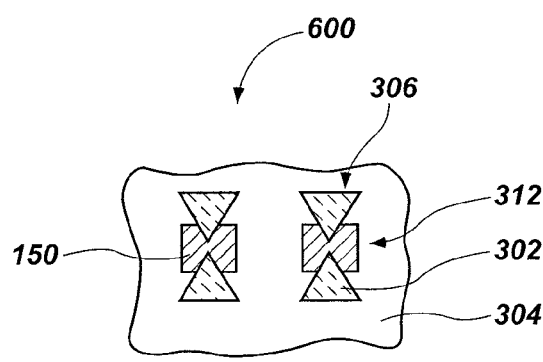
FIG. 9 is a partial plan view of an energy harvesting device according to an embodiment of the present disclosure.

As shown in FIGS. 7 through 9, the present disclosure also includes embodiments of energy harvesting devices having a PV material embedded in a substrate at or near feed gaps of antenna structures including resonance elements. In particular, FIG. 7 is a partial plan view of an energy harvesting device 400, FIG. 8 is a partial plan view of an energy harvesting device 500, and FIG. 9 is a partial plan view of an energy harvesting device 600.

Referring specifically to FIG. 7, the energy harvesting device 400 may include a plurality of resonance elements 102 formed and arranged in dipole pairs 106, as described above with reference to FIGS. 1 through 3. The resonance elements 102 may be formed in a substrate 104 as described above. However, the energy harvesting device 400 may not have a PV material underlying the substrate 104 and the associated resonance elements 102. Rather, the energy harvesting device 400 may include a PV material 150 embedded in the substrate 104 at or near the feed gap 112 of each dipole pair 106. The PV material 150 may be embedded in the substrate 104 by techniques known in the art, such as by imprint lithography, for example. Although the shape of the PV material 150 is shown as generally rectangular, the PV material 150 may be formed in any convenient shape, as will be appreciated by one of ordinary skill in the art.

The energy harvesting device 400 including the PV material 150 embedded at the feed gap 112 may reduce the cost, improve the efficiency, and/or improve the flexibility of the energy harvesting device 400. For example, embedding the PV material 150 at or near the feed gap 112 may provide material savings because less PV material 150 is used, relative to the embodiments shown in FIGS. 1 through 6, for example. Furthermore, the PV material 150 may be positioned in a location, i.e., at the feed gap 112, where the dipole pairs 106 concentrate the energy absorbed by the resonance elements 102, thus providing an efficient use of materials. Additionally, in embodiments having a flexible substrate 104, the overall flexibility of the energy harvesting device 400 may be improved relative to embodiments having the flexible substrate 104 bonded to a larger PV material.

Referring to FIG. 8, the energy harvesting device 500 may include resonance elements 202 arranged in tripoles 206 having a feed gap 212, as described above with reference to FIG. 5. The resonance elements 202 may be formed in a substrate 204. The energy harvesting device 500 may include a PV material 150 embedded in the substrate 204 at or near the feed gap 212 of each tripole 206.

Referring to FIG. 9, the energy harvesting device 600 may include resonance elements 302 arranged as bowties 306 having a feed gap 312, as described above with reference to FIG. 6. The resonance elements 302 may be formed in a substrate 304. The energy harvesting device 600 may include a PV material 150 embedded in the substrate 304 at or near the feed gap 312 of each bowtie 306.

Figure 10:
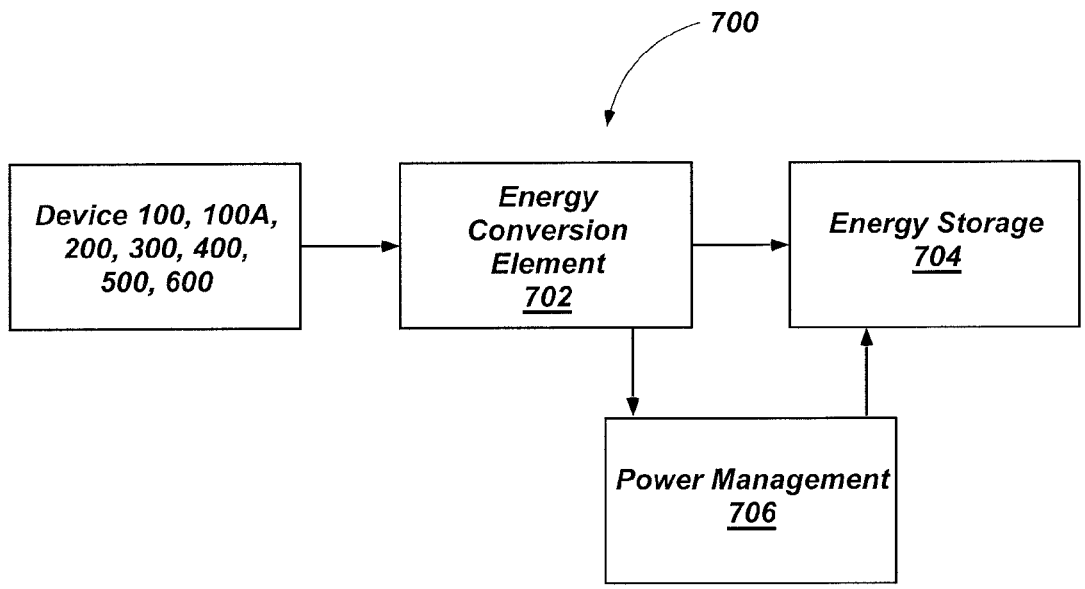
FIG. 10 is a schematic block diagram of an energy harvesting system that incorporates energy harvesting devices according to an embodiment of the present disclosure.

FIG. 10 is a schematic block diagram of an energy harvesting system 700 that incorporates energy harvesting devices according to an embodiment of the present disclosure. The energy harvesting system 700 may include any of the energy harvesting devices 100, 100A, 200, 300, 400, 500, 600 described above for capturing and concentrating electromagnetic radiation at a desired resonant frequency. The energy harvesting system 700 may further include at least one energy conversion element 702 which may convert and transfer the electromagnetic energy captured by the energy harvesting devices 100, 100A, 200, 300, 400, 500, 600 during the harvesting process. The energy harvesting system 700 may optionally further comprise an energy storage element 704 such as, for example, a lithium or polymer-form factor battery. In one example, the energy storage element 704 may be trickle charged by voltage from the energy conversion element 702. In some embodiments, the energy storage element 704 may be omitted, and the energy provided by the energy harvesting devices 100, 100A, 200, 300, 400, 500, 600 may be used directly by an electronic device (not shown). The system 700 may further include a power management system 706 for controlling the flow of energy between the energy conversion element 702 and the energy storage element 704 or electronic device. The energy storage element 704 may also be operatively coupled to an external component or system requiring energy. In some embodiments, one or more systems 700 may be coupled together to provide higher currents or voltages.

The devices and systems described in the present disclosure may improve energy harvesting efficiency, cost, and durability of photovoltaic materials. For example, tailoring the resonance elements 102, 102A, 102B, 202, 302 to absorb a wide range of radiation and reradiate energy according to the bandgap of the PV material 114, 150 may enable the use of less PV material without any loss of energy output. Experiments have demonstrated that using an NEC structure like those described herein with a PV material of amorphous silicon results in a 31% increase in absorption of focused white light as compared to a similar PV material of amorphous silicon without an associated NEC structure. Thus, less PV material may be used to produce the same or greater energy output, saving cost and reducing difficulty of manufacturing. Therefore, an economical manufacturing of high power density PV devices may be enabled. Furthermore, a thinner PV material may be more durable because thinner PV materials experience less degradation from radiation exposure over time. In addition, for a given PV material size and type, the NEC structures of the present disclosure increase energy generation by the PV material. Therefore, a smaller solar cell or other system for harvesting energy may be used to obtain the same energy output. Smaller energy harvesting systems may be useful in applications where size and weight are an important consideration, such as in land, air, or space vehicles, satellites, handheld electronic devices, etc.

Figure 11:
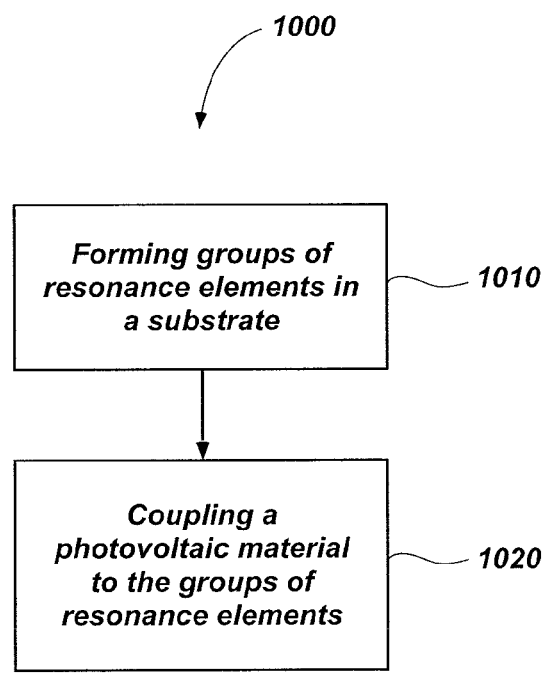
FIG. 11 is a flowchart illustrating a method of forming an energy harvesting system according to an embodiment of the present disclosure.

FIG. 11 is a flowchart 1000 illustrating a method of forming an energy harvesting system according to an embodiment of the present disclosure. The energy harvesting system includes an energy harvesting device, such as any of the energy harvesting devices 100, 100A, 200, 300, 400, 500, and 600 described above. At operation 1010, groups of resonance elements may be formed in a substrate. Forming groups of resonance elements in a substrate may include forming individual discrete resonance elements to have an elliptical or a triangular shape. As an example, the substrate may be formed out of at least one of polyethylene, polypropylene, acrylic, fluoropolymer, polystyrene, poly methylmethacrylate, polyethylene terephthalate, polyimide, and polyolefin, and the resonance elements may be formed of an electrically conductive material, such as one or more of manganese (Mn), gold (Au), silver (Ag), copper (Cu), aluminum (Al), platinum (Pt), nickel (Ni), iron (Fe), lead (Pb), and tin (Sn), or any other suitable electrically conductive material. At operation 1020, a photovoltaic material may be coupled to the groups of resonance elements. Coupling a photovoltaic material to the groups of resonance elements may include capacitively coupling the photovoltaic material to the groups of resonance elements. In some embodiments, coupling a photovoltaic material to the groups of resonance elements may include embedding the photovoltaic material in the substrate at feed gaps of each group of discrete resonance elements. In some embodiments, coupling a photovoltaic material to the groups of resonance elements may include at least one of overlaying, laminating, and bonding the photovoltaic material to the substrate.

Embodiments of the present disclosure, such as those described above, may include apparatuses or devices that are amenable to installation and use in a variety of locations and for a variety of applications. For example, since the devices may be formed using flexible substrates, they may be integrated into structures or devices having complex and contoured surfaces. Such apparatuses may be integrated into, for example, clothing, backpacks, automobiles (or other transportation apparatuses), consumer electronics (e.g., laptop computers, cell phones, tablet computing devices), satellites, space stations, and a variety of other types of devices and structures.

CONCLUSION

An embodiment of the present disclosure includes an energy harvesting device that includes a substrate and a plurality of resonance elements comprising a conductive material in the substrate. Each resonance element of the plurality is configured to collect energy in at least visible and infrared light spectra and to reradiate energy having a wavelength within the range of about 0.8 µm to about 0.9 µm. The plurality of resonance elements is arranged in groups of two or more resonance elements.

Another embodiment of the present disclosure includes a system for harvesting electromagnetic radiation. The system comprises a substrate comprising at least one of a dielectric material and a semiconductor material, a plurality of resonance elements comprising a conductive material carried by the substrate, and a photovoltaic material coupled to the substrate and capacitively coupled to at least one resonance element of the plurality of resonance elements. The plurality of resonance elements is arranged in groups having at least one of a dipole, a tripole, and a bowtie configuration. Each resonance element is configured to absorb incident electromagnetic radiation and reradiate at least some of the absorbed electromagnetic radiation at a bandgap energy of the photovoltaic material.

Yet another embodiment of the present disclosure includes a method for forming an energy harvesting device. The method includes forming groups of two or more discrete resonance elements in a substrate such that each group of discrete resonance elements is configured to collect electromagnetic radiation having a frequency between approximately 0.1 THz and approximately 1,000 THz. At least some of the groups of two or more discrete resonance elements are configured to collect electromagnetic radiation having a frequency between approximately 0.1 THz and approximately 30 THz. The method further includes coupling a photovoltaic material to the groups of two or more discrete resonance elements.

While the present disclosure is susceptible to various modifications and alternative forms, specific embodiments have been shown by way of example in the drawings and have been described in detail herein. However, the invention is not intended to be limited to the particular forms disclosed. Rather, the invention covers all modifications, combinations, equivalents, and alternatives falling within the scope of the following appended claims and their legal equivalents.

What is claimed is:

1. An energy harvesting device, comprising:
a substrate;
a plurality of resonance elements comprising a conductive material coupled with the substrate, wherein:
    each resonance element of the plurality of resonance elements is configured to collect radiant energy in at least visible and infrared light spectra;
    each resonance element of the plurality of resonance elements is configured to reradiate energy having a wavelength within the range of about 0.8 µm to about 0.9 µm; and
    the plurality of resonance elements is arranged in groups of two or more resonance elements; and
a photovoltaic material embedded in the substrate only at feed gaps of the groups of two or more resonance elements and operably coupled to the plurality of resonance elements.

2. The energy harvesting device of claim 1, wherein each resonance element of the plurality of resonance elements has a shape selected from the group consisting of an elliptical shape and a triangular shape.

3. The energy harvesting device of claim 2, wherein each group of two or more resonance elements includes at least one of a dipole, a tripole, and a bowtie configuration.

4. The energy harvesting device of claim 2, wherein each resonance element of the plurality of resonance elements has an elliptical shape with a minor axis of approximately 30 nm, a major axis in a range of approximately 40 nm to approximately 80 nm, and a thickness in a range of approximately 30 nm to approximately 100 nm.

5. The energy harvesting device of claim 2, wherein:
each group of two or more resonance elements comprises a pair of two resonance elements in a dipole configuration;
a feed gap distance between the resonance elements of each pair of two resonance elements is in a range of approximately 20 nm to approximately 60 nm;
a longitudinal distance between adjacent pairs of two resonance elements is in a range of approximately 30 nm to approximately 70 nm; and
a lateral distance between adjacent pairs of two resonance elements is in a range of approximately 20 nm to approximately 40 nm.

6. The energy harvesting device of claim 2, wherein:
each group of two or more resonance elements comprises three resonance elements in a tripole configuration; and
each resonance element in the group is oriented at an angle of approximately 120 degrees from adjacent resonance elements in the group.

7. The energy harvesting device of claim 1, wherein the substrate comprises at least one of silicon, germanium, gallium arsenide, polyethylene, polypropylene, acrylic, fluoropolymer, polystyrene, poly methylmethacrylate, polyethylene terephthalate, polyimide, and polyolefin.

8. A system for harvesting electromagnetic radiation, comprising:
a substrate comprising at least one of a dielectric material and a semiconductor material;
a plurality of resonance elements comprising a conductive material carried by the substrate, the plurality of resonance elements arranged in groups having at least one of a dipole, a tripole, and a bowtie configuration; and
a photovoltaic material embedded in the substrate only at feed gaps of the groups of the resonance elements and capacitively coupled to at least one resonance element of the plurality of resonance elements, wherein each resonance element of the plurality of resonance elements is configured to absorb incident electromagnetic radiation and reradiate at least some of the absorbed electromagnetic radiation at a bandgap energy of the photovoltaic material.

9. The system of claim 8, wherein the photovoltaic material is bonded to the substrate.

10. The system of claim 8, wherein the plurality of resonance elements is positioned in the substrate such that the incident electromagnetic radiation will pass through at least a portion of the substrate before arriving at the plurality of resonance elements.

11. The system of claim 8, wherein the substrate comprises a first substrate and the plurality of resonance elements comprises a first portion of resonance elements, and further comprising:
a second substrate comprising a dielectric material coupled to the photovoltaic material on an opposite side thereof from the first substrate; and
a second portion of resonance elements in the second substrate, the second portion of resonance elements configured to absorb incident electromagnetic radiation having a different wavelength than at least one wavelength of the incident electromagnetic radiation that the first portion of resonance elements is configured to absorb.

12. The system of claim 11, wherein the first portion of resonance elements is configured to absorb incident electromagnetic radiation from the sun and the second portion of resonance elements is configured to absorb thermal incident electromagnetic radiation.

13. A method for forming an energy harvesting device, the method comprising:
forming groups of two or more discrete resonance elements comprising a conductive material in a substrate such that each group of two or more discrete resonance elements is configured to:

collect electromagnetic radiation having a frequency between approximately 0.1 THz and approximately 1,000 THz, wherein at least some of the groups of two or more discrete resonance elements are configured to collect electromagnetic radiation having a frequency between approximately 0.1 THz and approximately 30 THz; and reradiate energy having a wavelength within the range of about 0.8 µm to about 0.9 µm; and embedding a photovoltaic material in the substrate only at feed gaps of each group of two or more discrete resonance elements and coupling the photovoltaic material to the groups of two or more discrete resonance elements.

14. The method of claim 13, wherein coupling the photovoltaic material to the groups of two or more discrete resonance elements comprises capacitively coupling the photovoltaic material to the groups of two or more discrete resonance elements.

15. The method of claim 13, wherein forming groups of two or more discrete resonance elements in a substrate comprises forming the groups in at least one of a dipole, a tripole, and a bowtie configuration.

16. The method of claim 13, wherein forming groups of two or more discrete resonance elements further comprises forming individual discrete resonance elements to have an elliptical or a triangular shape.

17. The method of claim 13, further comprising forming the substrate out of at least one of polyethylene, polypropylene, acrylic, fluoropolymer, polystyrene, poly methylmethacrylate, polyethylene terephthalate, polyimide, and polyolefin.

18. The method of claim 13, wherein coupling the photovoltaic material to the groups of two or more discrete resonance elements comprises at least one of overlaying, laminating, and bonding the photovoltaic material to the substrate.

19. The energy harvesting device of claim 1, wherein:

the photovoltaic material comprises a bandgap engineered material; and the plurality of resonance elements is configured to absorb radiation at a range of wavelengths and to reradiate energy at a bandgap energy of the photovoltaic material.

* * * * *